(12) United States Patent
Lerma (10) Patent No.: US 8,975,744 B1
(45) Date of Patent: Mar. 10, 2015

(54) THREE-DIMENSIONAL, RECONFIGURABLE SYSTEM PACKAGE

(71) Applicant: The Boeing Company, Seal Beach, CA (US)

(72) Inventor: Jaime Lerma, Murrieta, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/031,074

(22) Filed: Sep. 19, 2013

(51) Int. Cl.
*H01L 23/50* (2006.01)
*H01L 23/48* (2006.01)

(52) U.S. Cl.
CPC ...................................... *H01L 23/48* (2013.01)
USPC ......................................................... 257/724

(58) Field of Classification Search
USPC ........................... 257/723–726; 438/107–109
See application file for complete search history.

(56) References Cited

U.S. PATENT DOCUMENTS 8,103,853 B2    1/2012  Ramesh et al.
8,288,175 B2 *  10/2012 Loiselet ........................ 438/14

OTHER PUBLICATIONS

Johnson et al., "3-D Packaging: A Technology Review," Jun. 23, 2005, 70 pages.

"System on a chip," 2013, Wikipedia, The Free Encyclopedia, [retrieved on Jun. 27, 2013] Retrieved using Internet <URL: http://en.wikipedia.org/w/index.php?title=System_on_a_chip&oldid=565608275, 4 pages.

"Transformational Wideband Communication Capabilities for the Warfighter," Boeing: Boeing Satellites, 2013, [retrieved on Jul. 18, 2013] Retrieved from the Boeing website using Internet <URL: http://www.boeing.com/boeing/defense-space/space/bss/factsheets/702/wgs/wgs_factsheet.page, 2 pages.

* cited by examiner

*Primary Examiner* — Daniel Shook
(74) *Attorney, Agent, or Firm* — Womble Carlyle Sandridge & Rice, LLP (57) ABSTRACT

A three-dimensional, reconfigurable system package is provided for an electronic system. The system package includes a plurality of layers of active electronic components integrated both vertically and horizontally into a single circuit, with the layers being vertically stacked and spaced apart from one another. The layers include a base layer whose active electronic components include a reconfigurable system-on-chip configured to at least partially implement the electronic system, and an upper layer whose active electronic components include electronic components configured to signal process RF signals. The system package also includes a RF tunnel that extends vertically between the base layer and upper layer, and that is configured to provide structural support and vertical separation for the upper layer, and transport at least some RF signals between the base layer and upper layer. And a cover is secured to the base layer and encases the active electronic components and RF tunnel.

22 Claims, 5 Drawing Sheets

THREE-DIMENSIONAL, RECONFIGURABLE SYSTEM PACKAGE

TECHNOLOGICAL FIELD

The present disclosure relates generally to an electronic system and, in particular, to a three-dimensional, reconfigurable system package for an electrical system.

BACKGROUND

For a number of years, electronic systems have been constructed from the assembly of various commercial off-the-shelf (COTS) components supported and electrically connected by one or more printed circuit boards (PCBs). Increased demands for smaller form factor and weight, and reduced cost and power have led to a number of other, more modern approaches for constructing electronic systems. Examples of these more modern approaches include system-on-chip (SoC) in which the components of a system are integrated into a single integrated circuit (IC) (sometimes referred to as a "chip"), and system-in-package (SiP) in which a number of chips are integrated in a single package. Three-dimensional (3D) IC is another approach in which multiple layers of components are integrated both horizontally and vertically into a single chip.

While SoC, SiP and 3D IC approaches have achieved a smaller form factor and weight, and reduced cost and power, they pose certain challenges for builders of such systems for certain applications. This is particularly true of systems built for high-performance radio frequency (RF) applications. Therefore, it may be desirable to have a system package that addresses the aforementioned limitations.

BRIEF SUMMARY

Example embodiments of the present disclosure are generally directed to a three-dimensional (3D), reconfigurable system package for an electronic system, which takes into account at least some of the challenges of past approaches, as well as possibly other issues. According to one aspect, the system package includes a plurality of layers of active electronic components integrated both vertically and horizontally into a single circuit, with the layers being vertically stacked and spaced apart from one another. The layers include a base layer whose active electronic components include a system-on-chip (SoC) configured to at least partially implement the electronic system, and one or more upper layers whose active electronic components include electronic components configured to signal process at least some radio frequency (RF) signals. More particularly, for example, the SoC may be a mixed-signal integrated circuit including digital and analog functions. In this regard, the SoC may include many if not most of digital functions of the electronic system, and analog function that interfaces an RF section. And the electronic components of the upper layer(s) may include those configured to amplify, filter and/or convert frequencies in the RF domain.

The system package also includes a RF tunnel that extends vertically between the base layer and upper layer(s), and that is configured to provide structural support and vertical separation for the upper layer(s), and transport at least some RF signals between the base layer and upper layer(s). And the system package includes a cover or housing (generally "cover") secured to the base layer and encasing the active electronic components and RF tunnel. In some examples, the RF tunnel is further configured to carry power to the upper layer(s).

In some examples, the system package further includes a mini-backplane that extends vertically from the base layer up to the upper layer(s) along an edge of the upper layer(s), and which may be further encased by the cover. The mini-backplane may be configured to provide structural support and vertical separation for the upper layer(s), and transport at least some signals between the base layer and upper layer(s). In some further examples, the mini-backplane may be further configured to carry power to the upper layer(s).

In some examples, the RF tunnel may be configured to transport higher-frequency RF signals, and the mini-backplane may be configured to transport digital signals and lower-frequency RF signals.

In some examples, the SoC may be a reconfigurable SoC configured to transmit a digital control signal to at least one active electronic component of the upper layer(s) to configure at least one parameter of the respective active electronic component(s). In these examples, the SoC may be configured to transmit the digital control signal via the mini-backplane.

In some examples, the active electronic components of the upper layer(s) (e.g., second layer) may include a low-noise amplifier (LNA) configured to amplify external RF signals input to the system package. In some examples, the active electronic components of the upper layer(s) (e.g., third layer) may include a power amplifier (PA) configured to amplify RF signals output external to the system package. And in some examples, the active electronic components of either or both the base layer and upper layer(s) may include one or more switches configured to control routing of RF signals throughout the system package.

In some examples, the system package may further include a fixture secured to the base layer and configured to provide added structural support for the upper layer(s). In these examples, the fixture may include opposing supports that extend vertically from the base layer up to the upper layer(s), and a pair of guide rails between the supports to structurally support the upper layer(s).

In some examples, the system package may further include an RF isolation structure configured to provide added structural support for the upper layer(s), and RF isolation between the base layer and upper layer(s). In these examples, the RF isolation structure may include layer members over respective layers, and support members that extend vertically between layers or along edges of the layers.

Example implementations of the present disclosure may provide a number of advantages with respect to SoC, 3D IC and PCB. As to SoC, for example, example implementations may provide a superior technology (e.g., GaN, GaAs, etc.) to allow higher performance and higher-frequency functions. Also as to SoC, example implementations may also reduce thermal issues, improve test-verification methods, and improve manufacturing yields. As to 3D IC, example implementations may eliminate one or more extraneous processing steps (e.g., through-silicon vias (TSVs), chip stacking, etc.), and may also reduce thermal issues, improve test-verification methods, ease of reconfiguration and improve manufacturing yields. And as to PCB, example implementations may provide a smaller form factor and weight, and reduce cost and power. While some variations may be a derivation of SiP, example implementations may allow higher performance, improved smaller form factor and weight and ease of reconfiguration. Based on specific industry use of SiP, example implementations may have advantages stated in contrast to 3D IC or those stated in contrast to PCB.

The features, functions and advantages discussed herein may be achieved independently in various example embodiments or may be combined in yet other example embodiments further details of which may be seen with reference to the following description and drawings.

BRIEF DESCRIPTION OF THE DRAWING(S)

Having thus described example embodiments of the disclosure in general terms, reference will now be made to the accompanying drawings, which are not necessarily drawn to scale, and wherein:

DETAILED DESCRIPTION

Some embodiments of the present disclosure will now be described more fully hereinafter with reference to the accompanying drawings, in which some, but not all embodiments of the disclosure are shown. Indeed, various embodiments of the disclosure may be embodied in many different forms and should not be construed as limited to the embodiments set forth herein; rather, these example embodiments are provided so that this disclosure will be thorough and complete, and will fully convey the scope of the disclosure to those skilled in the art. For example, reference may be made herein to dimensions of components that may be related. Those and other similar relationships may be absolute or approximate to account for variations that may occur, such as those due to engineering tolerances or the like. Like reference numerals refer to like elements throughout.

Figure 1:
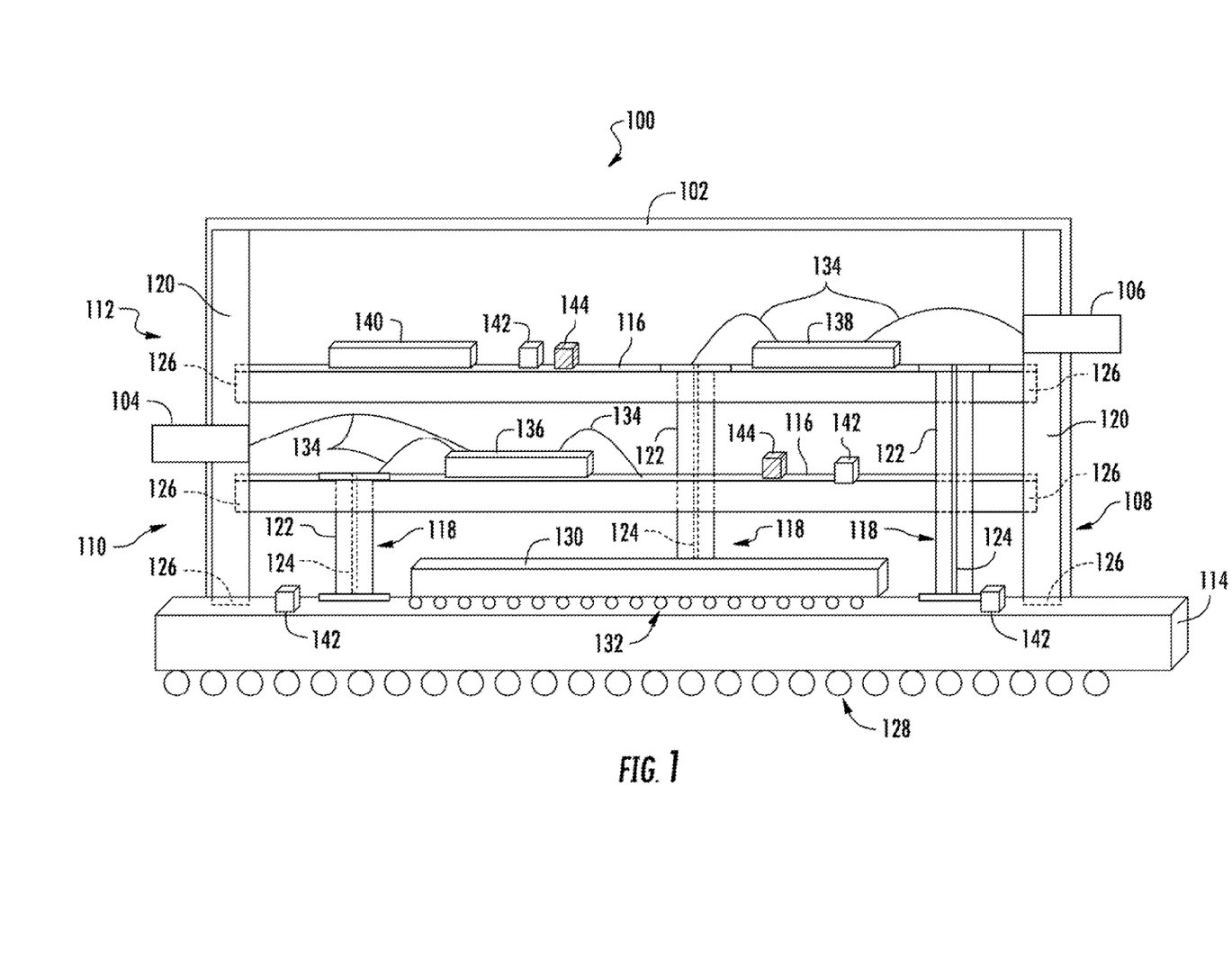
FIGS. 1, 2, 3 and 4 are exaggerated cross-section views of a three-dimensional (3D), reconfigurable system package according to various example embodiments.

FIG. 1 is an exaggerated cross-section view of a three-dimensional (3D), reconfigurable system package 100 for an electronic system built for radio frequency (RF) applications, according to one example embodiment of the present disclosure. The system package generally includes a plurality of layers of active electronic components that may be integrated both vertically and horizontally into a single circuit, and that may be encased by an appropriate cover (or housing) 102 such as a metal cover. The system package may include one or more external interfaces (external to the system package) secured to the cover, such as one or more coaxial RF connectors for use with higher-frequency RF. As shown, for example, the system package may include a first RF connector 104 for input of external RF signals to the system package, and a second RF connector 106 for output of RF signals external to the system package. In some examples, the first and second RF connectors may be coaxial RF connectors such as MSSS coaxial connectors manufactured by Micro-Mode Products Inc. of El Cajon, Calif.

The layers of active electronic components within the system package 100 may include a plurality vertically stacked and spaced apart from one another. FIG. 1 illustrates first, second and third layers 108, 110, 112, although it should be understood that the system package may include fewer or more than three layers. The first layer may be configured to function as the base of the system package to which the cover 102 may be secured, and may at times be referred to as the base layer. Layers above the base layer, including the second and third layers, may be referred to as upper layers. The vertical stacking of the layers reduces the form factor of the system package, while spacing the layers apart from one another may improve thermal management of the system package and its active electronic components. In some examples, electronic components that generate greater heat such as higher-power components may be placed on a topmost layer (farthest from the base layer in the vertical stack of layers) where a heat spreader may be added and configured to work in conjunction with the cover 102 to dissipate heat.

The base layer 108 of the system package 100 may include an electronic package 114 such as a ceramic-based package, plastic-based package or the like on which one or more active components may be bonded or otherwise secured. Other layers including the second and third layers 110, 112 may include an appropriate substrate 116 such as an alumina substrate on which one or more active components may be bonded or otherwise secured. The layers may be vertically stacked and spaced apart from one another in a number of different manners. As shown, for example, the system package may include one or more RF tunnels 118 and/or one or more mini-backplanes 120 configured to not only structurally support the layers, but also transport signals between the layers.

The RF tunnels 118 may be configured to provide structural support and vertical separation for the upper layers including the second and third layers 110, 112 above the base layer 108 (similar to posts in a building). The RF tunnels may also be configured to transport at least some RF signals such as higher-frequency RF signals between the layers, and may further carry power to upper layers including the second and third layers above the base layer. Each RF tunnel may extend vertically from one layer to another (between layers), such as from the base layer to the second layer or third layer, and may pass through openings fabricated in any intermediate layers between the respective layers.

The RF tunnel 118 may include a (cylindrical) grounded outer shell 122 having opposing ends on which appropriate surface mounts may be applied, and within which an isolated RF signal line 124 may extend between the ends. In some examples, the RF tunnel may be composed of a coaxial RF connector (e.g., MSSS coaxial connector) on which appropriate surface mounts may be applied. The RF tunnel may be mounted by its surface mounts to the layers between which the tunnel extends; and in instances in which the RF tunnel passes through an intermediate layer, the RF tunnel may include an appropriate side mount at the intermediate layer.

Similar to the RF tunnels 118, the mini-backplanes 120 may be configured to provide structural support and vertical separation for the second and third layers 110, 112 above the base layer 108 within the system package 100. While the RF tunnels may provide interior structural support to surfaces of the layers (similar to posts in a building), though, the mini-backplanes may be configured to provide structural support and vertical separation at one or more edges of the upper layers (similar to walls in a building). Each mini-backplane may therefore extend vertically from the base layer up to at least the topmost layer along an edge of the layers. The mini-backplanes may also be configured to transport at least some signals such as digital signals and/or low-frequency RF (analog) signals between the layers, and may further carry power to upper layers including the second and third layers above the base layer.

Each mini-backplane may include electrical connectors 126 for connection to respective layers 108, 110, 112 to secure the layers to the backplane and link the layers together for the transport of signals. In some examples, each electrical connector may be a clamp-type connector such as a high-density, clamp-type connector mounted to the mini-backplane (e.g., similar to those used on daughterboards).

As also shown, and now turning more specifically to the base layer 108, the electronic package 114 may have opposing front and back surfaces. The back surface of the electronic package may be bonded or otherwise secured to an appropriate surface-mount packaging 128 such as a ball grid array (BGA), column grid array (CGA) or the like for mounting the system package 100. The surface-mount packaging may also provide an appropriate interface (e.g., interconnection pins) for electrically connecting the electronic system of the system package to another electronic system or device, such as for the communication of data between the electronic system and the other electronic system/device. In some examples, the surface-mount packaging may also provide an appropriate interface for supplying power to the system package.

The front surface of the electronic package 114 may support a system-on-chip (SoC) 130 such as a reconfigurable SoC configured to at least partially implement the electronic system of the system package 100. In one example, the SoC may be assembled as a flip chip including solder bumps 132 for bonding and electrically connecting the SoC to the front surface of the electronic package. The SoC generally integrates components of the electronic system into a single integrated circuit (IC), and it may include a number of interconnected components configured to provide functions such as multiple of the following: digital, analog and/or mixed-signal processing, computing, memory, data converting, clocking, power management, RF (e.g., lower-frequency RF) and the like—all on a single die. The SoC may also be configured to transmit digital control signals to various other electronic components to configure or reconfigure the electronic system of the system package, and may transmit the digital control signals to electronic components of upper layers via the mini-backplane 120. The SoC may also be configured to provide calibration data for digitally-assisted RF to improve performance of the electronic system.

In some examples, the SoC 130 may include one or more processors such as microcontrollers, microprocessors, digital signal processors (DSPs) or the like. The SoC may include one or more volatile and/or non-volatile memory blocks such as random access memory (RAM), read-only memory (ROM), electronically erasable programmable ROM (EEPROM), flash memory or the like. The SoC may include one or more digital-to-analog converters (DACs), analog-to-digital converters (ADCs) for data conversion; one or more oscillators, phase-locked loops (PLLs) and the like for clocking and other timing functions; and/or one or more voltage regulators, power management circuits and the like for power management. The SoC may include an RF section configured to provide at least some RF functionality such as lower-frequency RF functionality, and/or lower-performance requirements. The SoC may include one or more external interfaces (external to the SoC), such as a coaxial RF connector for use with higher-frequency RF. And in some examples, the SoC may include other components such as digital circuits, analog circuits, mixed-signal circuits, sensors and the like, in addition to or in lieu of at least some of the foregoing.

In some examples, the first RF connector 104 may be located on the cover 102 between the second and third layers 110, 112, and the second RF connector 106 may be located on the cover above the third layer. Electrical connections from the first and second RF connectors to components within the system package 100, as well as various electrical connections between components within the system package, may be made in a number of different manners, such as by bond wires 134.

The system package 100 includes additional electronic components to signal process RF signals. In some examples, these components include Monolithic Microwave Integrated Circuit (MMIC) components, such as those manufactured by TriQuint Semiconductor, Hittite Microwave Corporation and the like. In one example, the second layer 110 may include a low-noise amplifier (LNA) 136 configured to amplify various RF signals such as external RF signals input to the system package 100. The LNA may be electrically connected to the first RF connector 104, and the second layer and/or RF signal line 124 (via a pad on substrate 116) of the respective RF tunnel 118 between the second layer and base layer 108, such as by bond wires 134. Similarly, the third layer 112 may include a power amplifier (PA) 138 configured to amplify various RF signals such as RF signals output external to the system package. The PA may be electrically connected to the second RF connector 106, and the third layer and/or RF signal lines of respective RF tunnels between the third layer and base layer (e.g., by bond wires).

In some examples, one or more of the base, second or third layers 108, 110, 112 may include one or more additional or alternative electronic components such as one or more mixers 140, one or more switches 142 and/or one or more other, secondary electronic components 144. The mixer may be configured to translate the frequency of RF signals in various instances or applications. The switches may be on various layers and configured to control the routing of RF signals throughout the system package 100 and its layers, such as to implement an RF switch matrix; and in some examples, a switch may be composed of a sea of transistors. In one example, the system package may include two mixers to handle two frequency regions which may be switched between to reconfigure the electronic system for different needs. The secondary electronic components may include, for example, filters to remove unwanted noise, inductors (e.g., high-Q inductors), matching components and the like for matching and filtering, and other types of electronic components that complete an RF subsystem (e.g., higher-performance RF subsystem) residing on the upper layers.

The system package 100 of example implementations may provide a number of benefits and advantages in addition to or in lieu of those explained above. The system package may provide a single package for an entire higher-frequency RF communication system (electronics system). The SoC 130 may allow reduction of components relative to more conventional electronic systems built for RF applications, and the SoC and mini-backplane 120 may allow configuration or reconfiguration of the electronic system for different applications. In some examples, functionality below a certain frequency (e.g., 2 GHz) may be implemented on the SoC, with other functionality at higher frequencies (above the respective frequency) moved to upper layers above the SoC.

The SoC may itself be configurable or reconfigurable, and may transmit digital control signals to other electronic components to configure or reconfigure at least one parameter of the respective electronic components, and thus the electronic system. This may include, for example, configuration of the gains of various amplifiers such as the LNA 136 and/or PA 138, frequency tuning of mixers 140, configuration of switches 142 to establish an RF switch matrix, configuration of secondary electronic components 144 such as various matching components, filters and the like. The SoC may be further configured to alter RF signals such as to compensate for distortion in the electronic system (linearization), and may be configured to transmit RF signals to various components of the upper layers for purposes such as tuning, calibration or the like.

The system package 100 may further provide clocking functionality such as PLLs, voltage-controlled oscillators (VCOs) and the like. Reconfigurability may be added by tuning, frequency hopping or the like within the same package. At lower frequencies, the SoC 130 may provide clocking functionality; or at higher frequencies, the functionality may be provided at an upper layer. This signal may then be routed to a mixer 140 on the same layer, or via an RF tunnel 118 if on another layer. One or more RF tunnels may extend between upper layers (e.g., first and second layers). And these and other RF tunnels may be configured as required to complete the RF subsystem.

Figure 2:
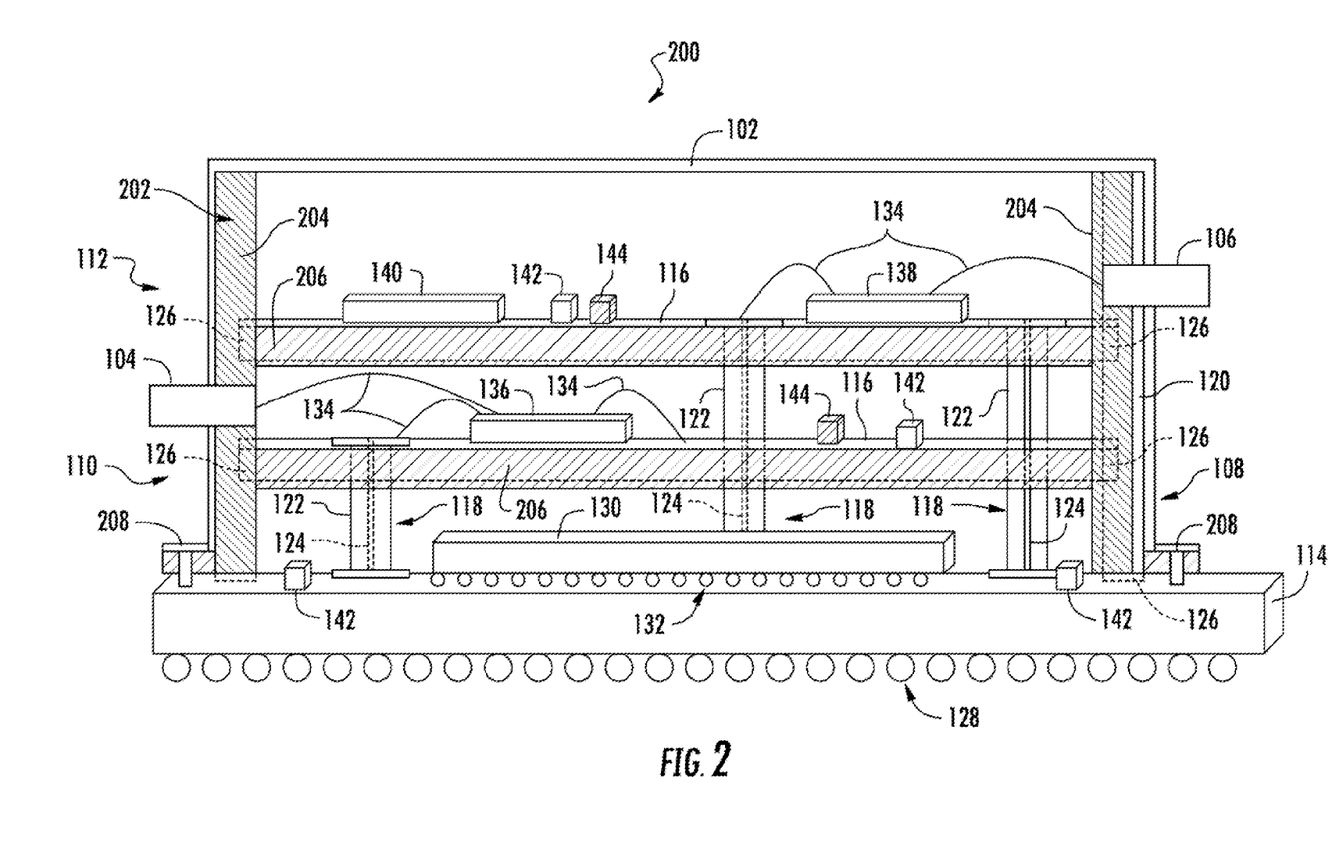

In some examples, the system package 100 may include even further structural support to its layers of active electronic components and/or operation of its electronic system. FIG. 2 is an exaggerated cross-section view of a 3D, reconfigurable system package 200 for an electronic system, according to another example embodiment of the present disclosure. The system package 200 of FIG. 2 is similar to the system package 100 of FIG. 1, but including a fixture 202 to provide added structural support for upper layers (layers above the base layer 108) of the system package including the second and third layers 110, 112. This fixture may be of benefit in a number of applications such as those involving increased tolerance to vibration.

Figure 3:
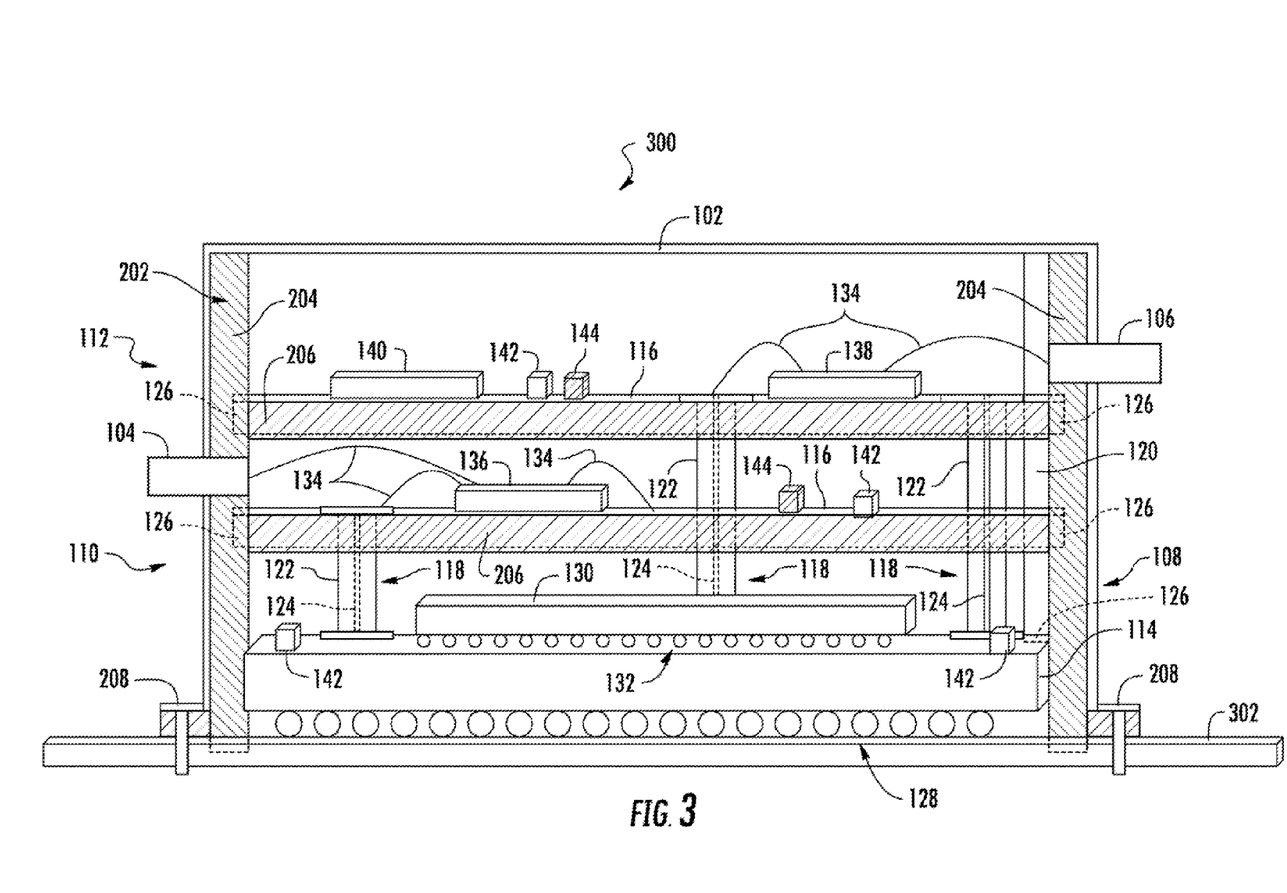

The fixture 202 may be formed of metal similar to the cover 102, and may include constructed similar to an electronics card cage. The fixture may have opposing supports 204 that extend vertically from the base layer up to at least the topmost layer along respective edges of the layers. The fixture may include pairs of guide rails 206 between the supports at respective layers to structurally support the respective layers (one guide rail per pair being shown in the figure). The fixture may be secured to the base layer, such as by one or more fasteners 208. In another similar example, the fixture may be instead mounted to a substrate printed circuit board (PCB). This is shown in FIG. 3 for an example 3D, reconfigurable system package 300 including a PCB 302 to which the fixture may be mounted by appropriate fasteners or solder.

The system package 100 of FIG. 1 is shown including opposing mini-backplanes 120 that extend vertically from the base layer up to at least the topmost layer along respective edges of the layers. In the system package 200 of FIG. 2, however, at least some of the structural support provided by the mini-backplanes may instead be provided by the fixture 202. Thus, as shown in the FIG. 2, the system package 200 may include fewer mini-backplanes configured to serve more primarily to transport signals, as opposed to providing structural support.

Figure 4:
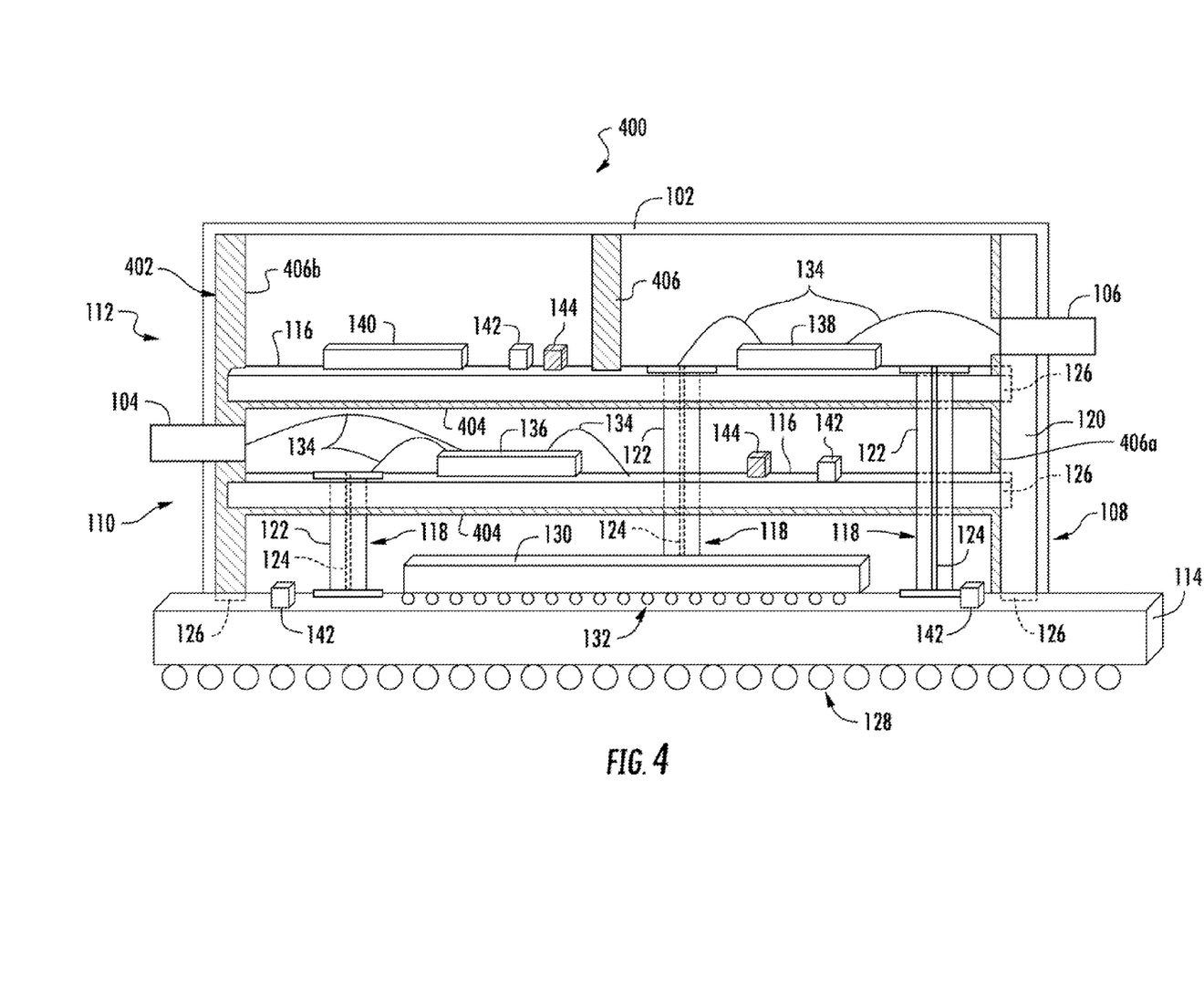

FIG. 4 is an exaggerated cross-section view of a 3D, reconfigurable system package 400 for an electronic system, according to yet another example embodiment of the present disclosure. The system package 400 of FIG. 4 is similar to the system package 100 of FIG. 1, but including RF isolation structure 402 that may provide added structural support for upper layers (layers above the base layer 108) of the system package including the second and third layers 110, 112. The RF isolation structure may also provide RF isolation between layers and/or between components of a layer. Although shown separately, though, in some examples, a system package may include both a fixture and RF isolation structure.

The RF isolation structure 402 may be formed of metal, and may include layer members 404 over respective layers 110, 112, and support members 406 that extend vertically from one layer to another (between layers) and/or along edges of the layers. In some examples, the RF isolation structure may not include a layer member over the topmost layer 112, as the cover 102 may serve its function. The RF isolation structure may structurally support layers of the system package 400, as well as provide RF isolation between the layers, components and/or external to the package. And as also shown, one of the layer members over the topmost layer may function to structurally support the cover 102 above the topmost layer, and provide RF isolation for all of the layers from external to the system package.

The system package 100 of FIG. 1 is shown including opposing mini-backplanes 120 that extend vertically from the base layer up to at least the topmost layer along respective edges of the layers. Similar to the system package 200 of FIG. 2, in the system package 400 of FIG. 4, at least some of the structural support provided by the mini-backplanes may instead be provided by the RF isolation structure 402. In one example, the support members may include a first member 406a over the mini-backplane and configured to provide RF isolation, and a second member 406b in place of an opposing mini-backplane and configured to provide RF isolation and additional structural support. Similar to the system package of FIG. 2, the system package of FIG. 4 may include fewer mini-backplanes configured to serve more primarily to transport signals, as opposed to providing structural support. In some examples, the layers 108, 110, 112 may be connected to the second member by other than electrical connectors 126. Instead, the second member may include clamp-type structures, grooves or the like for connection to respective layers.

As indicated above and evidenced by the different example implementations, the system package 100, 200, 300, 400 of example implementations may include any number of different layers of active electronic components, which may be vertically arranged in any of a number of different manners. The second layer 110 of electronic components is shown and described as being between the base layer 108 and third layer 112. But it should be understood that the second layer may instead be above the third layer, with the third layer of electronic components being between the base layer and third layer. Even further, one or more other layers may be included above the base layer, and above, below or between the second layer or third layer.

The system package 100, 200, 300, 400 of example implementations may be for electronic systems built for any of a number of different RF applications. For example, the system package may be built for various electronic systems onboard satellites. These electronic systems may include transponders such as data transponder systems, data channelizers such as digital channelizers in which the system package may be used for each of one or more channels, and the like. In these instances, the system package of example implementations may significantly reduce the size, weight and power requirements of the satellite, and/or increase its capability.

In other examples, the system package 100, 200, 300, 400 of example implementations may be built for various wireless communication systems onboard vehicles including for example, those in the aerospace, marine and automotive industries, as well as wireless communication systems found in other communication radios.

In accordance with example implementations, the system package 100, 200, 300, 400 may be reconfigurable in the field or prior to installation into an end product. This reconfiguration may be applied in many areas of the package. For example, the SoC 130 may include computing functions that allow firmware to be reinstalled to update system function. The SoC may include its own internal configuration changes, such as power management that powers off one or more unused sections to save power. The SoC may incorporate one or more of a number of useful techniques such as self-healing electronics, redundancy, calibration and the like. The SoC may also be configured to adjust upper-layer electronics such as by controlling adjustable gain and frequency shifts, which may be communicated via the mini-backplane 120. This electronic system may also be configured to switch between two different RF paths such as to provide different RF communication systems from the same package. In some examples, this may be accomplished by sending data to another RF tunnel. Switching at the upper layers may create the ability to program the RF section for different system requirements.

Figure 5:
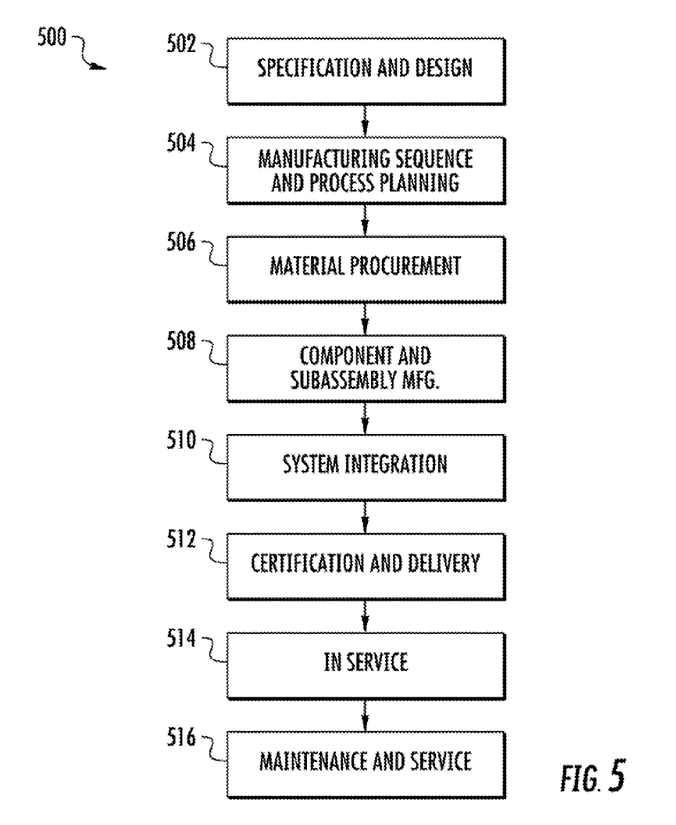
FIG. 5 is a flow diagram of an example aircraft production and service methodology.
Figure 6:
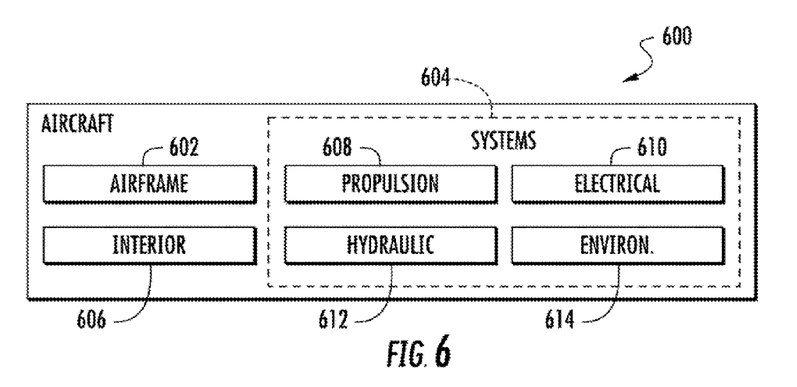
FIG. 6 is a block diagram of an example aircraft.

Referring now to FIGS. 5 and 6, example implementations may be used in the context of an aircraft manufacturing and service method 500 as shown in FIG. 5, and an aircraft 600 as shown in FIG. 6. During pre-production, the example method may include specification and design 502 of the aircraft and its supporting electronic systems, manufacturing sequence and processing planning 504 and material procurement 506. During production, component and subassembly manufacturing 508 and system integration 510 of the aircraft takes place. The disclosed system package 100, 200, 300, 400 may be specified for use, for example, during component and subassembly manufacturing, and/or system integration.

In various examples, the disclosed system package 100, 200, 300, 400 may be used during any one or more of the material procurement process 506, component and subassembly manufacturing process 508 or system integration 510. Thereafter, the aircraft 600 may go through certification and delivery 512 in order to be placed in service 514. While in service by a customer, the aircraft may be scheduled for routine maintenance and service 516 (which may also include modification, reconfiguration, refurbishment or the like). The system package of example implementations may be used while the aircraft is in service, and in one example, during maintenance and service of the aircraft.

Each of the processes of the example method 500 may be performed or carried out by a system integrator, third party and/or operator (e.g., customer). For the purposes of this description, a system integrator may include for example any number of aircraft manufacturers and major-system subcontractors; a third party may include for example any number of vendors, subcontractors and suppliers; and an operator may include for example an airline, leasing company, military entity, service organization or the like.

As shown in FIG. 6, an example aircraft 600 produced by the example method 500 may include an airframe 602 with a plurality of systems 604 and an interior 606. Examples of high-level systems 604 include one or more of a propulsion system 608, electrical system 610, hydraulic system 612, environmental system 614 or the like. Any number of other systems 604 may be included. Although an aerospace example is shown, the principles of the disclosure may be applied to other industries, such as the marine and automotive industries.

The system package 100, 200, 300, 400 embodied herein may be employed during any one or more of the stages of the example production and service method 500. For example, the system package may be utilized during the production stages 508 and 510, which may in one example enable wireless communication by or between the aircraft 600 or various ones of its systems 604. Similarly, for example, the system package may be utilized while the aircraft is in service 514 and/or during maintenance and service 516, such as to again enable wireless communication by or between the aircraft or various ones of is systems. As explained above, the system package may achieve a number of benefits, which may be in turn realized by the aircraft and/or its manufacture and service.

Many modifications and other embodiments of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A three-dimensional (3D), reconfigurable system package for an electronic system, the system package comprising:
a plurality of layers of active electronic components integrated both vertically and horizontally into a single circuit, the plurality of layers being vertically stacked and spaced apart from one another, and including a base layer and an upper layer above the base layer,
wherein the active electronic components of the base layer include a system-on-chip (SoC) configured to at least partially implement the electronic system, and the active electronic components of the upper layer include electronic components configured to signal process at least some radio frequency (RF) signals;
a RF tunnel that extends vertically between the base layer and upper layer, the RF tunnel being configured to provide structural support and vertical separation for the upper layer, and transport at least some RF signals between the base layer and upper layer; and
a cover secured to the base layer and encasing the active electronic components and RF tunnel.

2. The system package of claim 1, wherein the RF tunnel is further configured to carry power to the upper layer.

3. The system package of claim 1 further comprising:
a mini-backplane that extends vertically from the base layer up to the upper layer along an edge of the upper layer, the mini-backplane being configured to provide structural support and vertical separation for the upper layer, and transport at least some signals between the base layer and upper layer,
wherein the cover further encases the mini-backplane.

4. The system package of claim 3, wherein the mini-backplane is further configured to carry power to the upper layer.

5. The system package of claim 3, wherein the RF tunnel is configured to transport higher-frequency RF signals, and the mini-backplane is configured to transport digital signals and lower-frequency RF signals.

6. The system package of claim 3, wherein the SoC is a reconfigurable SoC configured to transmit a digital control signal to at least one active electronic component of the upper layer to configure at least one parameter of the respective at least one active electronic component, the SoC being configured to transmit the digital control signal via the mini-backplane.

7. The system package of claim 1, wherein the active electronic components of the upper layer include a low-noise amplifier (LNA) configured to amplify external RF signals input to the system package.

8. The system package of claim 1, wherein the active electronic components of the upper layer include a power amplifier (PA) configured to amplify RF signals output external to the system package.

9. The system package of claim 1, wherein the active electronic components of either or both the base layer and upper layer include one or more switches configured to control routing of RF signals throughout the system package.

10. The system package of claim 1 further comprising:
a fixture secured to the base layer and configured to provide added structural support for the upper layer, the fixture including opposing supports that extend vertically from the base layer up to the upper layer, and a pair of guide rails between the supports to structurally support the upper layer.

11. The system package of claim 1 further comprising:
an RF isolation structure configured to provide added structural support for the upper layer, and RF isolation between the base layer and upper layer, the RF isolation structure including layer members over respective layers, and support members that extend vertically between layers or along edges of the layers.

12. A three-dimensional (3D), reconfigurable system package for an electronic system, the system package comprising:
a plurality of layers of active electronic components integrated both vertically and horizontally into a single circuit, the plurality of layers being vertically stacked and spaced apart from one another, and including a base layer, and second and third layers above the base layer, wherein the active electronic components of the base layer include a system-on-chip (SoC) configured to at least partially implement the electronic system, and the active electronic components of the each of the second and third layers include electronic components configured to signal process at least some radio frequency (RF) signals;
a plurality of RF tunnels that extend vertically between the base layer and respective ones of the second and third layers, the RF tunnels being configured to provide structural support and vertical separation for the second and third layers, and transport at least some RF signals between the base layer and respective ones of the second and third layers; and
a cover secured to the base layer and encasing the active electronic components and RF tunnels.

13. The system package of claim 12, wherein the RF tunnels are further configured to carry power to respective ones of the second and third layers.

14. The system package of claim 12 further comprising:
a mini-backplane that extends vertically from the base layer up to an uppermost of the second and third layers along an edge of the second and third layers, the mini-backplane being configured to provide structural support and vertical separation for the second and third layers, and transport at least some signals between the base layer and second and third layers,
wherein the cover further encases the mini-backplane.

15. The system package of claim 14, wherein the mini-backplane is further configured to carry power to the second and third layers.

16. The system package of claim 14, wherein the RF tunnel is configured to transport higher-frequency RF signals, and the mini-backplane is configured to transport digital signals and lower-frequency RF signals.

17. The system package of claim 14, wherein the SoC is a reconfigurable SoC configured to transmit a digital control signal to at least one active electronic component of at least one of the second or third layers to configure at least one parameter of the respective at least one active electronic component, the SoC being configured to transmit the digital control signal via the mini-backplane.

18. The system package of claim 12, wherein the active electronic components of the second layer include a low-noise amplifier (LNA) configured to amplify external RF signals input to the system package.

19. The system package of claim 12, wherein the active electronic components of the third include a power amplifier (PA) configured to amplify RF signals output external to the system package.

20. The system package of claim 12, wherein the active electronic components of at least one of the base layer, or second or third layers include one or more switches configured to control routing of RF signals throughout the system package.

21. The system package of claim 12 further comprising:
a fixture secured to the base layer and configured to provide added structural support for the second and third layers, the fixture including opposing supports that extend vertically from the base layer up to an uppermost of the second and third layers, and pairs of guide rails between the supports to structurally support respective ones of the second and third layers.

22. The system package of claim 12 further comprising:
an RF isolation structure configured to provide added structural support for respective ones of the second and third layers, and RF isolation between the base layer, and second and third layers, the RF isolation structure including layer members over respective layers, and support members that extend vertically between layers or along edges of the layers.

* * * * *